(12) United States Patent
Cideciyan

(10) Patent No.: US 9,166,618 B2
(45) Date of Patent: Oct. 20, 2015

(54) DATA ENCODING AND DECODING

(71) Applicant: International Business Machines Corporation, Armonk, NY (US)

(72) Inventor: Roy D. Cideciyan, Rueschlikon (CH)

(73) Assignee: International Business Machines Corporation, Armonk, NY (US)

(*) Notice: Subject to any disclaimer, the term of this patent is extended or adjusted under 35 U.S.C. 154(b) by 348 days.

(21) Appl. No.: 13/872,331

(22) Filed: Apr. 29, 2013

(65) Prior Publication Data

US 2014/0281830 A1  Sep. 18, 2014

(30) Foreign Application Priority Data

Mar. 15, 2013 (EP) .................... 13001326

(51) Int. Cl.
*H03M 13/00* (2006.01)
*H03M 5/14* (2006.01)

(52) U.S. Cl.
CPC ..................... *H03M 5/145* (2013.01)

(58) Field of Classification Search
CPC ... H04L 1/0057; H04L 1/0061; H04L 1/0041; H04L 1/0083; H04L 1/0072
USPC ........................................ 714/776
See application file for complete search history.

(56) References Cited

U.S. PATENT DOCUMENTS

| | | | |
|---|---|---|---|
| 6,952,405 B2 | 10/2005 | Tsang et al. | |
| 7,127,653 B1 | 10/2006 | Gorshe | |
| 8,270,433 B2 | 9/2012 | Jiang | |
| 8,644,341 B1* | 2/2014 | Petranovich | 370/474 |
| 2002/0172184 A1* | 11/2002 | Kim et al. | 370/344 |
| 2010/0091794 A1 | 4/2010 | Jiang | |
| 2011/0013690 A1 | 1/2011 | Kobayashi et al. | |
| 2013/0235886 A1 | 9/2013 | Wang | |

OTHER PUBLICATIONS

A. Vazquez et al., "A New Family of High-Performance Parallel Decimal Mulitpliers," IEEESymposium on Computer Arithmetic (ARITH'07), 2007, pp. 1-10.
U.S. Appl. No. 13/765,382; filed Feb. 12, 2013; Counterpart Application Entitled, "Encoding of Data for Transmission," Inventor: Roy D. Cideciyan.

(Continued)

*Primary Examiner* — Albert Decady
*Assistant Examiner* — Enam Ahmed
(74) *Attorney, Agent, or Firm* — Cantor Colburn LLP; Gail Zarick

(57) ABSTRACT

A data encoding method includes receiving a sequence of N scrambled blocks produced by scrambling a sequence of N preliminary blocks comprising one of a data block and a control block, the control block being one of K types and including a block-type field, each scrambled block having a block header indicating a scrambled data block or a scrambled control block; encoding the sequence of N scrambled blocks into an encoded block by deleting the block headers, and in the event the sequence contains any scrambled control blocks, deleting a set of scrambled bits corresponding to respective block-type field bits of at least one control block in the sequence of preliminary blocks such that the other block-type field bits are sufficient to indicate the type of control block, and adding position indicator bits indicating position of each scrambled control block in the received sequence of scrambled blocks.

20 Claims, 12 Drawing Sheets

(56) References Cited

OTHER PUBLICATIONS

International Telecommunication Union, "Interfaces for the Optical Transport Network (OTN)," Rec. ITU-T G. 709/Y. 1331, Dec. 2009, pp. 1-218.

Part 3: Carrier Sense Multiple Access with Collision Detection (CSMA/CD) Access Method and Physical Layer Specifications; Amendment 1:Physical Layer and Management Parameters for 10 Gb/s Operation, Type 10GBASE-T IEEE Computer Society, Sep. 1, 2006. pp. 1-181.

S. Trowbridge, "How can 40 Gb Ethernet be designed to fit existing ODU3 transport?" IEEE HSSG Meeting, San Francisco: Jul. 16-19, 2007, pp. 1-15.

M. Teshima et al., "Bit-Error-Tolerant (512*N)B/(513*N+1)B Code for 40GB/s and 100Gb/s Ethernet Transport." IEEE: 2008, pp. 1-6.

* cited by examiner

64B/66B block formats

| Input Data | | Block Payload | | | | | | | | |
|---|---|---|---|---|---|---|---|---|---|---|
| | SYNC | 65 | | | | | | | | |
| Bit Position: | 0 1 2 | | | | | | | | | |
| Data Block Format: | | | | | | | | | | |
| $D_0 D_1 D_2 D_3 D_4 D_5 D_6 D_7$ | 01 | $D_0$ | $D_1$ | $D_2$ | $D_3$ | $D_4$ | $D_5$ | $D_6$ | $D_7$ | |
| Control Block Formats: | | Block Type Field | | | | | | | | |
| $C_0 C_1 C_2 C_3 C_4 C_5 C_6 C_7$ | 10 | 0x1E | $C_0$ | $C_1$ | $C_2$ | $C_3$ | $C_4$ | $C_5$ | $C_6$ | $C_7$ |
| $S_0 D_1 D_2 D_3 D_4 D_5 D_6 D_7$ | 10 | 0x78 | | $D_1$ | $D_2$ | $D_3$ | $D_4$ | $D_5$ | $D_6$ | $D_7$ |
| $O_0 D_1 D_2 D_3 Z_4 Z_5 Z_6 Z_7$ | 10 | 0x4B | $O_0$ | $D_1$ | $D_2$ | $D_3$ | 0x000_0000 | | | |
| $T_0 C_1 C_2 C_3 C_4 C_5 C_6 C_7$ | 10 | 0x87 | 0x000_0000 | $C_1$ | $C_2$ | $C_3$ | $C_4$ | $C_5$ | $C_6$ | $C_7$ |
| $D_0 T_1 C_2 C_3 C_4 C_5 C_6 C_7$ | 10 | 0x99 | $D_0$ | | $C_2$ | $C_3$ | $C_4$ | $C_5$ | $C_6$ | $C_7$ |
| $D_0 D_1 T_2 C_3 C_4 C_5 C_6 C_7$ | 10 | 0xAA | $D_0$ | $D_1$ | | $C_3$ | $C_4$ | $C_5$ | $C_6$ | $C_7$ |
| $D_0 D_1 D_2 T_3 C_4 C_5 C_6 C_7$ | 10 | 0xB4 | $D_0$ | $D_1$ | $D_2$ | | $C_4$ | $C_5$ | $C_6$ | $C_7$ |
| $D_0 D_1 D_2 D_3 T_4 C_5 C_6 C_7$ | 10 | 0xCC | $D_0$ | $D_1$ | $D_2$ | $D_3$ | | $C_5$ | $C_6$ | $C_7$ |
| $D_0 D_1 D_2 D_3 D_4 T_5 C_6 C_7$ | 10 | 0xD2 | $D_0$ | $D_1$ | $D_2$ | $D_3$ | $D_4$ | | $C_6$ | $C_7$ |
| $D_0 D_1 D_2 D_3 D_4 D_5 T_6 C_7$ | 10 | 0xE1 | $D_0$ | $D_1$ | $D_2$ | $D_3$ | $D_4$ | $D_5$ | | $C_7$ |
| $D_0 D_1 D_2 D_3 D_4 D_5 D_6 T_7$ | 10 | 0xFF | $D_0$ | $D_1$ | $D_2$ | $D_3$ | $D_4$ | $D_5$ | $D_6$ | |

Figure 1 self-synchronizing scrambler serial data input x(i)

scrambled data output y(i)

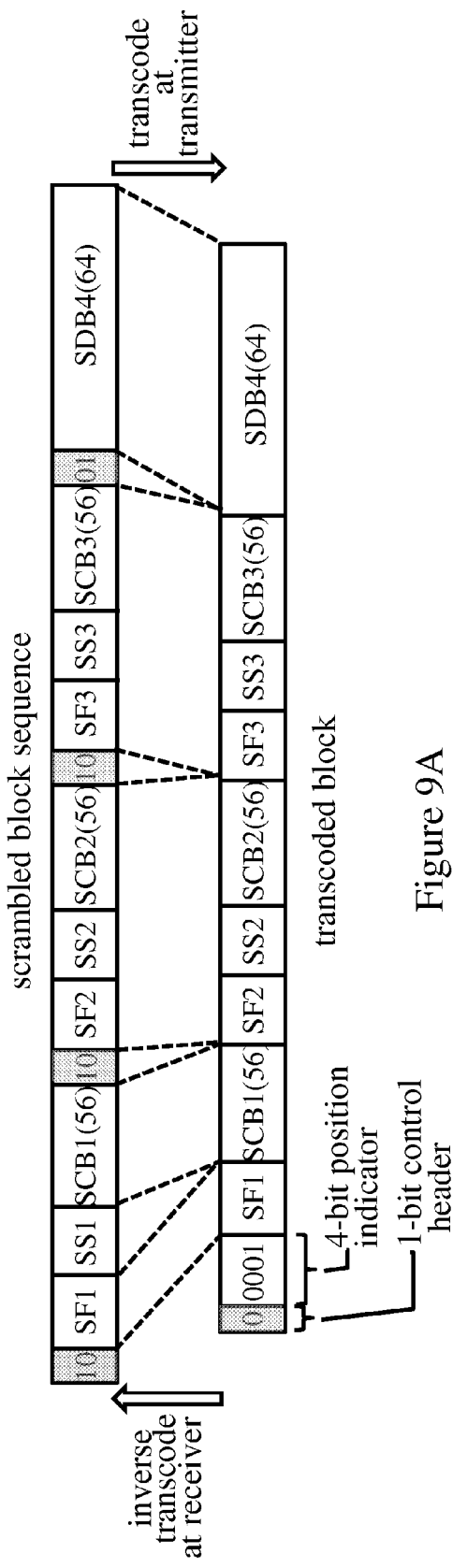
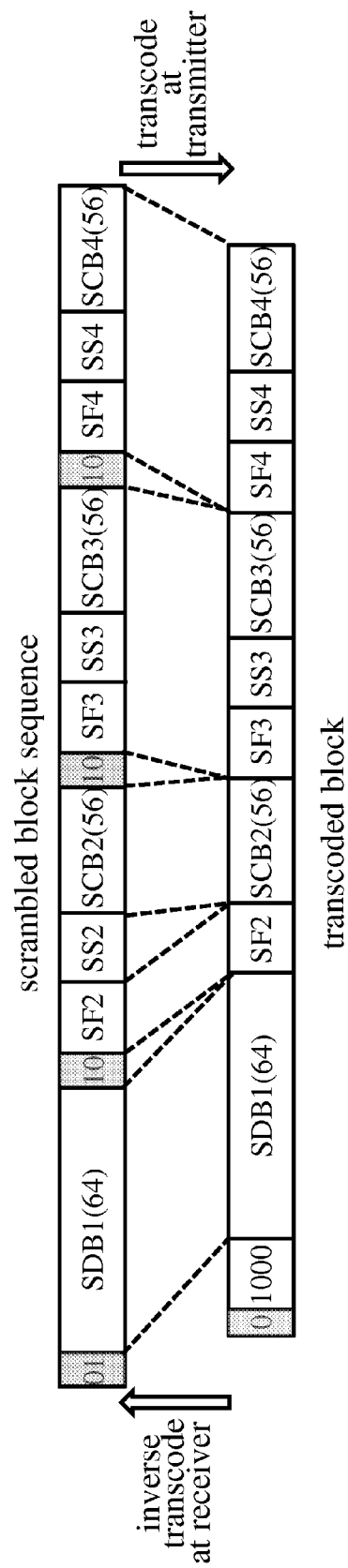
Figure 9A
Figure 9B

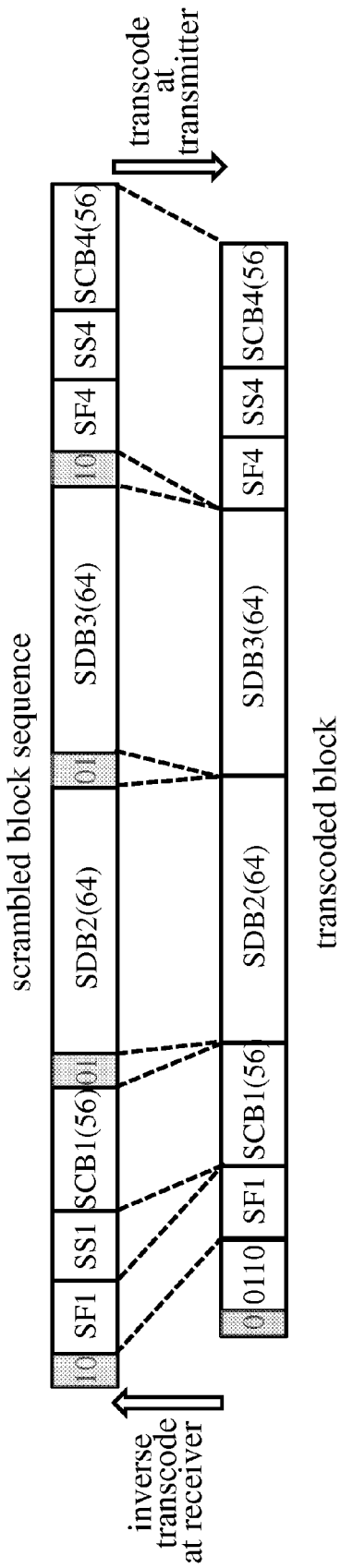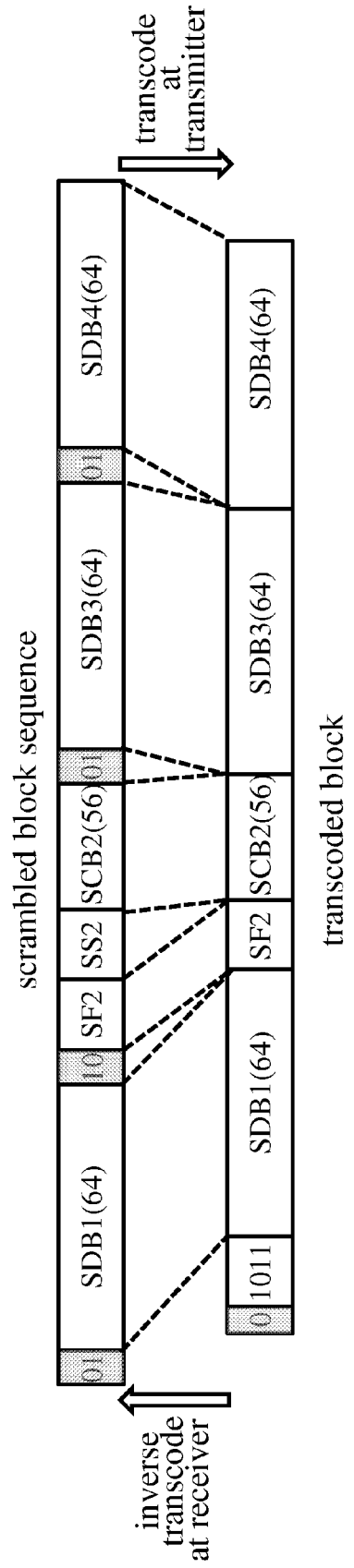
Figure 9C
Figure 9D

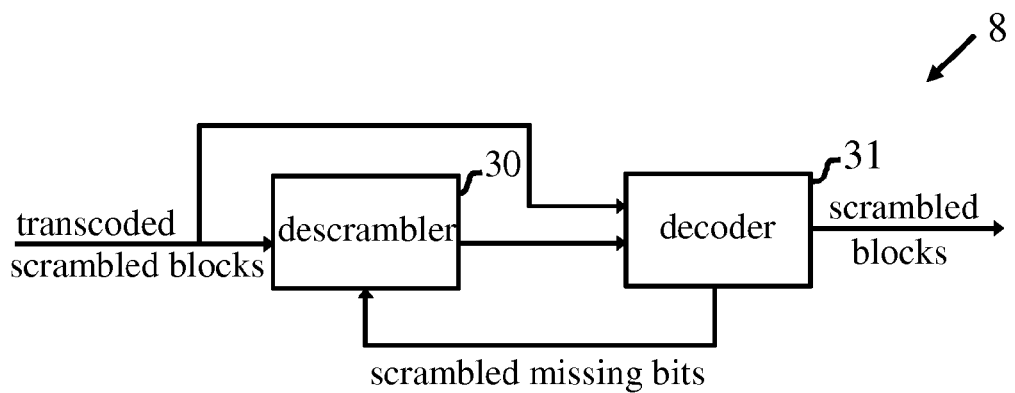
Figure 10
self-synchronizing descrambler
scrambled data input y(i)
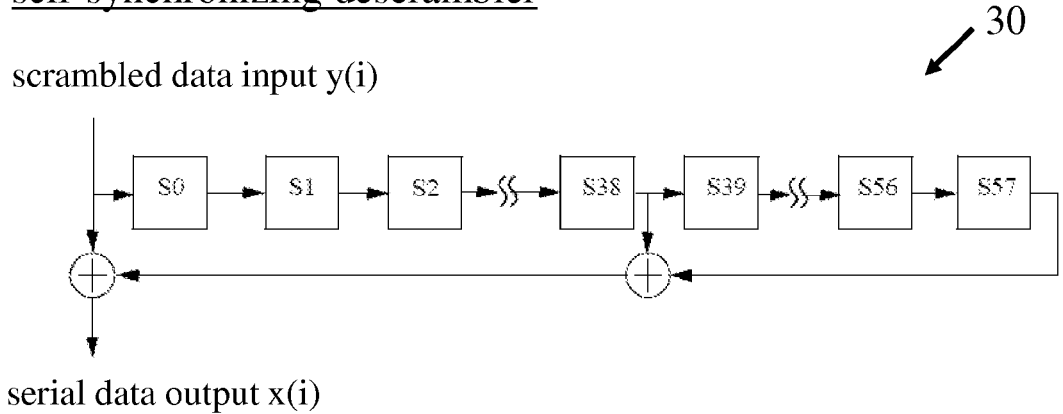
serial data output x(i)
Figure 12
| Fj(4) | 1 | 2 | 4 | 7 | 8 | 9 | A | B | C | E | F |
|---|---|---|---|---|---|---|---|---|---|---|---|
| Sj(4) | E | D | B | 8 | 7 | 9 | A | 4 | C | 1 | F |
Figure 14

DATA ENCODING AND DECODING

PRIORITY

This application claims priority to European Patent Application No. 13001326.1, filed Mar. 15, 2013, and all the benefits accruing therefrom under 35 U.S.C. §119, the contents of which in its entirety are herein incorporated by reference.

BACKGROUND

This invention relates generally to encoding and decoding of data transmitted over data communications networks.

Data to be transmitted over a communications network is commonly encoded in order to improve transmission characteristics, e.g., to improve data recovery rates and/or compress data for higher data transfer rates. In high-speed interconnect technologies such as 10 Gb/s, 40 Gb/s and 100 Gb/s Ethernet, InfiniBand, and 10-, 16- and 20-gigabit fiber channel, data is formatted in 64-bit blocks which undergo various stages of encoding and other processing prior to transmission. For example, an encoding stage employs a rate-64/66 modulation code. This code is a block code with the redundancy of two header bits per 64-bit payload. The 64-bit payload of each 66-bit block is either a control block, containing control information for the transmission process, or a data block containing actual data (i.e. user data, CRC (cyclic redundancy check) data and other "non-control" data). The 2-bit header of the 66-bit block indicates whether the attached payload is a data block or a control block.

The particular format of data and control blocks is defined by the appropriate transmission protocol. In general, different types of control block are defined for use in the system, and each control block includes a dedicated field which indicates the type of that control block. This field, referred to herein as a "block-type field", may contain one of a predefined set of K bit-patterns each corresponding to a respective one of K different types of control block used in the transmission system. In 100 Gb/s Ethernet, for example, the block format is defined in Ethernet standard IEEE 802.3ba-2010 and is shown in FIG. 1 of the accompanying drawings. The left-hand column of this table indicates the eight data or control "characters" (represented by letters D, C, O, S or T with suffix 0 to 7 denoting position in the block format) of data and control blocks. The rest of the table indicates the 66-bit output block format for the rate 64/66 modulation code. The 66-bit format for data blocks is shown at the top of the table. This starts with the 2-bit sync header 01 indicating that the 64-bit payload is a data block. There are eleven different types of control block in this instance and the 66-bit format for these is as indicated beneath the data block format. In each case this starts with the 2-bit sync header 10 indicating that the 64-bit payload is a control block. The control block commences with an 8-bit block-type field. This contains a bit-pattern representing one of eleven different values, indicated in hexadecimal in the column headed "Block Type Field", for the eleven different types of control block. The set of eleven 8-bit patterns constitute a rate-4/8 code, with Hamming distance 4, for indicating the eleven different types of control block.

Modulation encoded blocks are typically subject to various additional processing stages, such as scrambling, compression encoding and error correction processing, before transmission. Scrambling is a common process for improving transmission characteristics whereby each bit in an input block is combined with one or more other bits (whose values are generated continuously in a time-dependent manner, e.g., from previously scrambled bits) to produce a corresponding bit in the resulting scrambled block. Compression encoding (often referred to as "transcoding") is performed in order to increase data rates. In the systems described above, for example, rate-64/66 modulation coding is performed in the Physical Coding Sublayer (PCS) of the physical layer of the OSI (Open Systems Interconnection) reference model. Within this PCS layer, modulation encoded blocks are subject to a scrambling process illustrated in FIG. 2 of the accompanying drawings. The sequence of data or control blocks forming the payloads of successive 66-bit encoded blocks provides the input to the scrambler, the 2-bit sync headers being removed before scrambling. The resulting preliminary blocks at the scrambler input have 64 bits, $p_0, p_1, \ldots, p_{63}$. The input sequence of preliminary blocks is scrambled to produce a corresponding sequence of scrambled blocks, each with 64 bits $s_0, s_1, \ldots, s_{63}$. The scrambler is a self-synchronizing scrambler defined in the IEEE 802.3ba standard and shown in FIG. 3 of the accompanying drawings. This scrambler, which runs continuously, includes a 58-bit shift register S0 to S57 in a feedback arrangement with two modulo-2 adders (labeled "+" in the figure). After scrambling, the 2-bit sync header is added to each scrambled block to produce the transmit block. The resulting stream of transmit blocks is then further processed in the PCS sublayer before forwarding to the Reed-Solomon (RS) forward error correction (FEC) sublayer RS-FEC. For example, the blocks are distributed over multiple channels, or "lanes", after insertion of alignment markers for block recovery at the receiver.

Transcoding in the above systems is performed in the RS-FEC sublayer. The transcoding process transforms a group of N data or control blocks into a single encoded output block. For instance, N 66-bit blocks generated with the aforementioned rate-64/66 modulation code may be converted into a single (N*64+L)-bit block. Note that if L<2N, this transcoding process always results in compression. Such a transcoding process is described in our copending U.S. patent application Ser. No. 13/765,382, filed Feb. 12, 2013. One embodiment provides a 64b66b to 256b257b transcoding scheme which is used in the RS-FEC sublayer defined by IEEE Ethernet task force 802.3bj for full-duplex 100 Gb/s data transmission. This scheme encodes a sequence of N=4 rate-64/66 modulation coded blocks into a single 257-bit output block. The 2-bit sync headers of the 66-bit input blocks are deleted in the encoding process, along with the second 4-bit nibble of the block-type field of the first control block (if any) in the four-block sequence. Due to redundancy in the block-type field, the remaining block-type field bits are sufficient in themselves to indicate control block type. This redundancy in the block-type field permits recovery of the entire block-type field by mapping the remaining block-type field bits to the missing bits during the corresponding decoding process (referred to herein as "inverse transcoding") at the receiver. A 5-bit header is then added to the sequence. This includes a 4-bit position indicator to indicate the position of any control blocks in the block order of the four-block sequence, and a single bit to indicate whether or not the encoded output block contains any control blocks.

The transcoding schemes described in co-pending U.S. application Ser. No. 13/765,382, filed Feb. 12, 2013, preserve the order of data and control blocks in the input block sequence. Other known transcoding schemes reshuffle (rearrange) the order of the incoming blocks. For example, a 64b66b to 512b514b transcoding scheme is described in "Bit-Error-Tolerant (512*N)B/(513*N+1)B Code for 40 Gb/s and 100 Gb/s Ethernet Transport", Teshima et al., IEEE Infocom Workshops 2008. Control blocks in a sequence of N=8 rate-64/66 modulation coded input blocks are grouped together at the start of the encoded output block, after a 2-bit header. The 2-bit sync headers of the 66-bit input blocks are deleted, and the entire block-type field of each control block is replaced by a new 8-bit field. This includes a 4-bit encoding indicating control block type, and a 3-bit position field indicating the original position of the control block in the 8-block input sequence. The position field allows block order to be restored during inverse transcoding, and the 4-bit encoding permits identification of control block type and hence recovery of the block type field. A related 64b66b to 1024b1027b transcoding scheme is also described. Similar transcoding schemes based on reshuffling control blocks to the start of the encoded block have been described for 64b66b to 256b257b transcoding and 64b66b to 512b513b transcoding.

The transcoding processes described above exploit redundancy in the block-type field of control blocks, permitting deletion in the transcoder of certain block-type field bits which can be regenerated from the encoded blocks at the receiver. In order to do this, however, the input block sequence, which is received in scrambled form from the PCS sublayer, is first descrambled in the RS-FEC sublayer before supply to the transcoder. This results in a sublayer architecture which is shown in FIG. 4A, for the transmitter (TX) side, and in FIG. 4*b* for receiver (RX) side. (These figures show the architecture for non-return-to-zero signaling, a binary pulse amplitude modulation scheme, but the same basic steps are required in the alternative architecture for other pulse amplitude modulation signaling schemes). At the transmitter, scrambled blocks distributed over lanes from the PCS sublayer are received by the RS-FEC sublayer. The blocks are first aligned and alignment markers removed. The scrambled blocks are then descrambled for supply to the transcoder. After transcoding the blocks must be rescrambled, and alignment markers (mapped from the alignment function at the input) are reinserted. Error correction processing is then performed by an RS FEC encoder, and the resulting output words are distributed over lanes for onward transmission. This structure necessitates a corresponding structure at the receiver as shown in FIG. 4B. In addition to the resulting complex sublayer structure, the use of a self-synchronizing scrambler as described above requires use of such a scrambler following inverse transcoding in the receiver. This is undesirable due to the problem of error multiplication: a single bit error at the input of the RX self-synchronizing scrambler multiplies to infinitely many errors. Although the descrambler in the RX PCS sublayer regenerates the possibly-erroneous original sequence at the RX scrambler input, massive error multiplication within a sublayer is undesirable in an architecture that cleanly separates the sublayers.

SUMMARY

In one embodiment, a data encoding method includes receiving a sequence of N scrambled blocks produced by scrambling a sequence of N preliminary blocks comprising one of a data block and a control block, the control block being one of K types and including a block-type field, each scrambled block having a block header indicating a scrambled data block or a scrambled control block; encoding the sequence of N scrambled blocks into an encoded block by deleting the block headers, and in the event the sequence contains any scrambled control blocks, deleting a set of scrambled bits corresponding to respective block-type field bits of at least one control block in the sequence of preliminary blocks such that the other block-type field bits are sufficient to indicate the type of control block, and adding position indicator bits indicating position of each scrambled control block in the received sequence of scrambled blocks.

In another embodiment, a method for communicating data over a data communications network includes receiving a sequence of N scrambled blocks produced by scrambling a corresponding sequence of N preliminary blocks each of which comprises one of a data block and a control block, the control block being one of K types of control block and including a block-type field indicating the type of that control block, wherein each scrambled block has a block header indicating whether that scrambled block is a scrambled data block or a scrambled control block; encoding the sequence of N scrambled blocks into an encoded block by deleting the block header of each scrambled block, and if the sequence contains any scrambled control blocks, deleting from the sequence a set of scrambled bits corresponding to respective block-type field bits of at least one control block in the sequence of preliminary blocks such that the other block-type field bits of the at least one control block are sufficient to indicate the type of that control block, and adding position indicator bits indicating position of each scrambled control block in the received sequence of scrambled blocks; transmitting encoded blocks produced by the encoding of respective sequences of N scrambled blocks over the network to a receiver; and at the receiver, descrambling the encoded blocks to recover the other block-type field bits of the at least one control block in the sequence of preliminary blocks corresponding to a received encoded block containing any scrambled control blocks, regenerating missing block-type field bits of the at least one control block from the other block-type field bits, rescrambling the missing block-type field bits regenerated for a received encoded block to recover the set of scrambled bits deleted from the sequence of N scrambled blocks corresponding to that encoded block, and regenerating the sequences of N scrambled blocks corresponding to received encoded blocks from the encoded blocks and the recovered sets of scrambled bits.

In another embodiment, a data encoding apparatus for encoding a sequence of N scrambled blocks into an encoded block, the sequence of N scrambled blocks being produced by scrambling a corresponding sequence of N preliminary blocks each of which comprises one of a data block and a control block, the control block being one of K types of control block and including a block-type field indicating the type of that control block, wherein each scrambled block has a block header indicating whether that scrambled block is a scrambled data block or a scrambled control block, the apparatus comprising: an input buffer configured to receive the sequence of N scrambled blocks; and an encoder configured to produce the encoded block by deleting the block header of each scrambled block, and in the event the sequence contains any scrambled control blocks, deleting from the sequence a set of scrambled bits corresponding to respective block-type field bits of at least one control block in the sequence of preliminary blocks such that the other block-type field bits of the at least one control block are sufficient to indicate the type of that control block, and adding position indicator bits indicating position of each scrambled control block in the received sequence of scrambled blocks.

BRIEF DESCRIPTION OF THE SEVERAL VIEWS OF THE DRAWINGS

Exemplary embodiments of the invention will now be described, by way of example, with reference to the accompanying drawings in which:

FIG. 1 indicates the format of data and control blocks specified in current Ethernet standards;

FIGS. 9A through 9D indicate operation of the transcoding process for respective further sequences of input blocks;

FIG. 10 is a schematic representation of an inverse transcoder of the FIG. 5 system;

FIG. 12 illustrates the descrambler design for the inverse transcoder;

FIG. 14 indicates mapping between nibbles of block-type fields in the control block format of FIG. 1;

DETAILED DESCRIPTION

Figure 2:
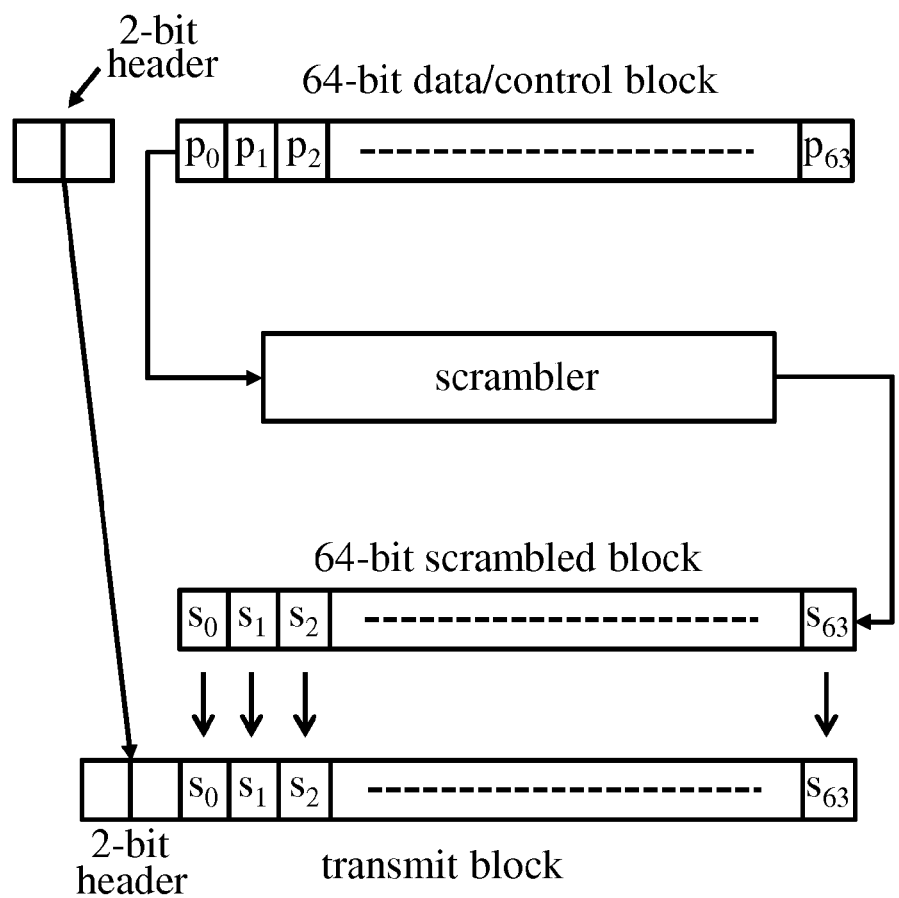
FIG. 2 illustrates scrambling of blocks in the Physical Coding Sublayer specified in current Ethernet standards.

One embodiment of an aspect of the present invention provides a data encoding method comprising receiving a sequence of N scrambled blocks produced by scrambling a corresponding sequence of N preliminary blocks each of which comprises one of a data block and a control block, the control block being one of K types of control block and including a block-type field indicating the type of that control block, wherein each scrambled block has a block header indicating whether that scrambled block is a scrambled data block or a scrambled control block; encoding the sequence of N scrambled blocks into an encoded block by deleting the block header of each scrambled block, and if the sequence contains any scrambled control blocks, deleting from the sequence a set of scrambled bits corresponding to respective block-type field bits of at least one control block in the sequence of preliminary blocks such that the other block-type field bits of the at least one control block are sufficient to indicate the type of that control block, and adding position indicator bits indicating position of each scrambled control block in the received sequence of scrambled blocks.

Data encoding methods embodying the invention can be used for transcoding in systems of the type described above. Unlike these prior systems, however, the encoding process is performed on scrambled input blocks. Even though the block-type field (BTF) data is scrambled, the invention recognizes that redundancy in this data can still be exploited to transcode the scrambled blocks. The predefined correspondence, or mapping, between different sets of BTF bits in an unscrambled block (which arises due to redundancy and which is exploited to permit deletion of particular BTF bits in earlier systems) is not transferred, after scrambling, to the corresponding bits at equivalent positions in the scrambled block. In spite of this, if scrambled bits corresponding to such a set of BTF bits are deleted, the deleted scrambled bits can still be recovered at the receiver as will be explained in detail below. Methods embodying the invention exploit recognition of this fact to permit transcoding (and corresponding inverse transcoding) of the scrambled blocks. This allows significant simplification of the architecture and implementation of the RS-FEC sublayer. In addition, the need for a self-synchronizing scrambler in this sublayer on the receiver side, with the consequent problem of massive error multiplication, is avoided.

In some embodiments of the invention, if the received sequence contains any scrambled control blocks, the encoding may include reordering the sequence of scrambled blocks in a predetermined manner. For example, scrambled control blocks may be grouped together at the start of the encoded block. In this case, the position indicator bits added during encoding indicate the original position of each scrambled control block in the received sequence, permitting recovery of the original block order at the receiver.

In specific embodiments, the encoding is performed such that the order of the N scrambled blocks in the received sequence is maintained in the encoded block. In this case, the position indicator bits can simply indicate position of each scrambled block in the block order of encoded block. Since this order is unchanged during encoding, the position indicator bits then indicate the position of each scrambled control block in the received sequence of blocks as well as the encoded sequence. The position indicator bits here can be a simple pattern of bits, one per block, indicating whether each block in the sequence order is data or control block.

In exemplary embodiments detailed below, the encoding method includes adding to the encoded block an L-bit control header indicating whether that encoded block contains any scrambled control blocks. Preferably $1 \leq L \leq 2$, whereby the control header contains either one or two bits. The term "header" is used herein in the general sense of a field other than the payload of a block and is not intended to restrict location of this field relative to the payload. Typically, however, such a header is located in front of the payload in the transmission order of the block.

An embodiment of a second aspect of the invention provides a data decoding method comprising receiving encoded blocks produced by a method according to the first aspect of the invention descrambling the encoded blocks to recover the other block-type field bits of the at least one control block in the sequence of preliminary blocks corresponding to a received encoded block containing any scrambled control blocks; regenerating missing block-type field bits of the at least one control block from the other block-type field bits; rescrambling the missing block-type field bits regenerated for a received encoded block to recover the set of scrambled bits deleted from the sequence of N scrambled blocks corresponding to that encoded block; and regenerating the sequences of N scrambled blocks corresponding to received encoded blocks from the encoded blocks and the recovered sets of scrambled bits.

Where, as in embodiments detailed below, the sequence of N scrambled blocks encoded into a received encoded block is produced from the sequence of N preliminary blocks by a self-synchronizing scrambler, the decoding method includes performing the descrambling of the encoded blocks using a self-synchronizing descrambler; and supplying the recovered sets of scrambled bits to the self-synchronizing descrambler for use in the descrambling.

In general, where features are described herein with reference to an embodiment of one aspect of the invention, corresponding features may be provided in embodiments of another aspect of the invention as appropriate.

Figure 5:
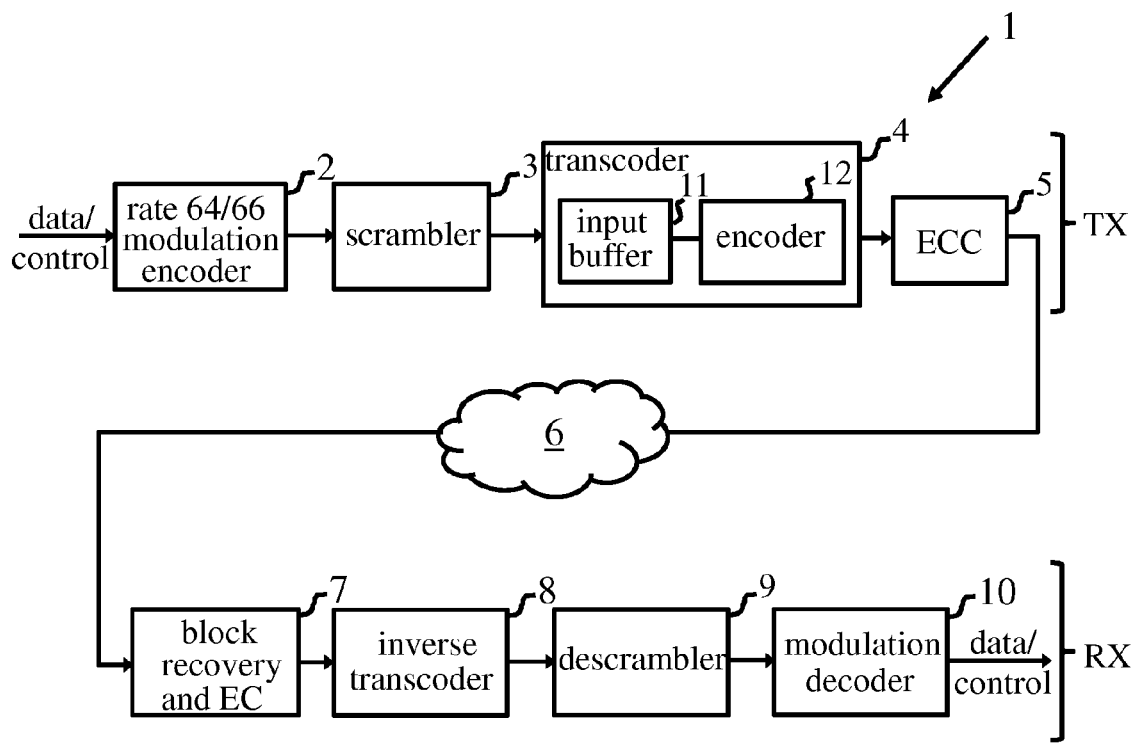
FIG. 5 is a schematic representation of a data communications system embodying the invention.

Referring now to FIG. 5, there is shown a simplified schematic of a data communications system 1 in which encoding and decoding methods embodying the invention can be employed. Communications system 1 may, for example, be embodied in a 100 Gb/s Ethernet system according to IEEE 802.3bj. A transmitter TX of system 1 comprises a modulation encoder 2, a scrambler module 3, a transcoder 4 and an error correction coder (ECC) 4 for processing data to be transmitted over a communications network 6. A receiver RX of the system comprises a block recovery and error correction (EC) module 7, an inverse transcoder 8, a descrambler module 9, and a modulation decoder 10.

In operation of system 1, 64-bit blocks of data and control characters are encoded by modulation encoder 2 into 66-bit blocks. Each 66-bit block has a 2-bit header and comprises either a data block or a control block as described above with reference to FIG. 1. The 66-bit blocks from modulation encoder 2 are supplied sequentially to scrambler module 3. Scrambler module 3 implements the scrambling process described above with reference to FIG. 2 using the self-synchronizing scrambler of FIG. 3. Each of the scrambled blocks from scrambler module 3 thus comprises a 64-bit scrambled data block, or scrambled control block, having a 2-bit (unscrambled) sync header which distinguishes data and control blocks. The resulting scrambled blocks are supplied in sequence to the transcoder 4 and received by an input buffer 11 of the transcoder. A sequence of N scrambled blocks, produced by scrambling a corresponding sequence of N preliminary, modulation encoded blocks in scrambler module 3, is stored in buffer 11 for the transcoding operation. Encoder 12 of transcoder 4 encodes the sequence of N 66-bit scrambled input blocks into a single (N*64+L)-bit encoded output block as described in detail below. Encoded blocks from transcoder 4 are transmitted over network 6 after forward error correction processing in ECC module 4. (In practice, blocks processed by transmitter TX may be subject to various other processing stages, e.g. processing steps defined in IEEE 802.3bj for 100 Gb/s Ethernet systems. Such additional steps are not central to the transcoding operations to be described and are therefore omitted from the figure for simplicity).

On receipt by receiver RX, transcoded blocks are recovered in module 7 and supplied, after error-correction processing, to inverse transcoder 8. The inverse transcoder 8 decodes each (N*64+L)-bit transcoded block into the original sequence of N 66-bit scrambled blocks as described in detail below. The scrambled blocks are output to descrambler module 9 which descrambles the blocks to reverse the scrambling operation of FIG. 3. The resulting descrambled 66-bit blocks are supplied to modulation decoder 10 which performs the inverse of the rate 64/66 code in modulation encoder 2, thereby to recover the data and control characters originally input on the transmitter side of system 1.

The operation of transcoder 4 and inverse transcoder 8 in the above system will now be described in more detail. The encoding/decoding functionality of these components could be implemented, in general, in hardware or software or a combination thereof, but is conveniently implemented in hardwired logic. Suitable implementations will be readily apparent to those skilled in the art from the description herein.

Figure 6:
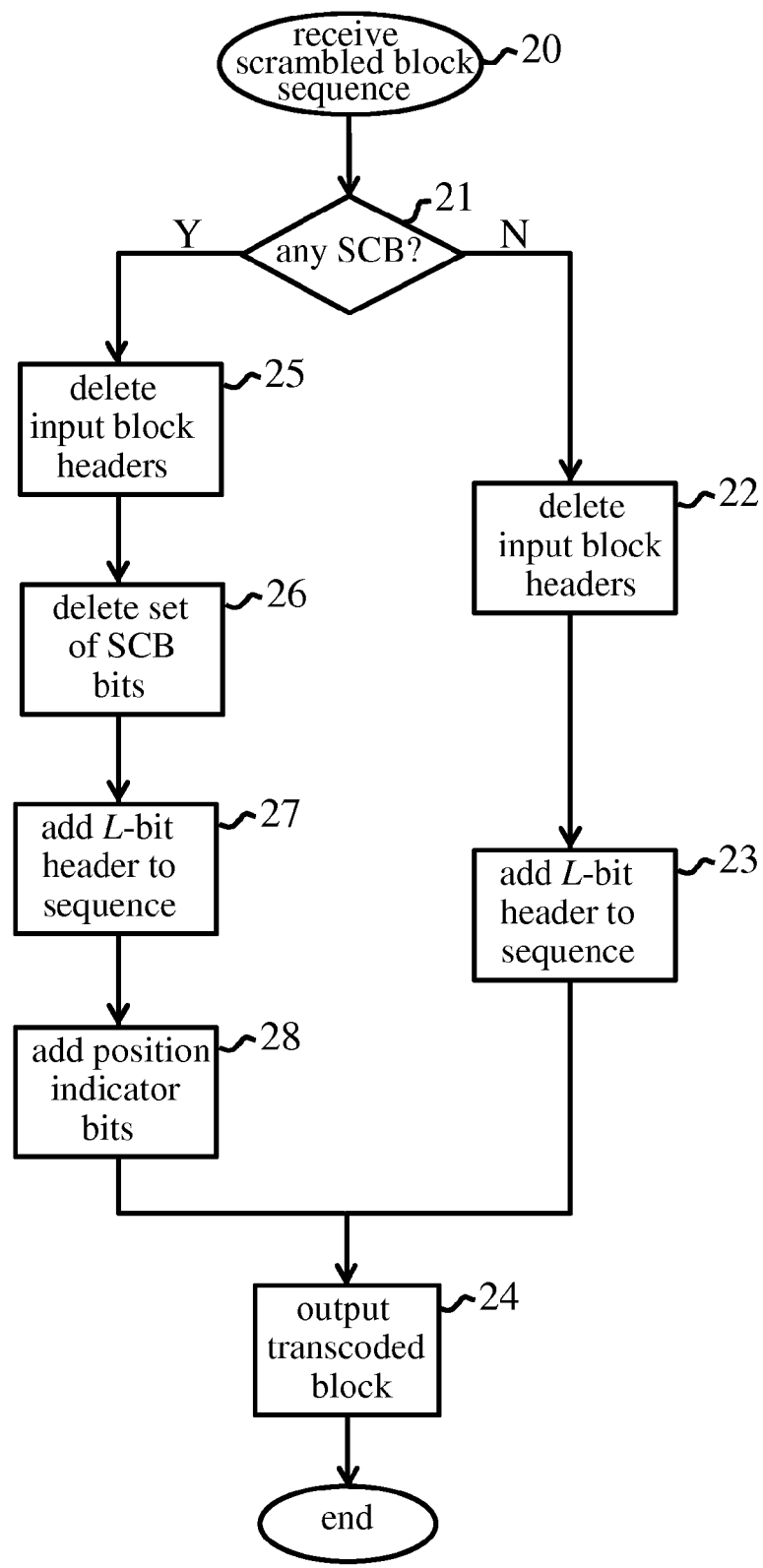
FIG. 6 indicates steps of a first transcoding process in the FIG. 5 system.

For the transcoding operation in transcoder 4, a sequence of N 66-bit scrambled blocks received by buffer 11 of the transcoder is processed by encoder 12 to produce the transcoded output block. In this exemplary embodiment, the order of the N scrambled blocks in the received sequence is maintained in the resulting transcoded block, and the transcoding operation simply involves addition and deletion of bits in the received block sequence. The main steps of this transcoding operation are indicated in FIG. 6. The operation begins at step 20 when the sequence of N scrambled blocks have been received by buffer 11. In step 21, encoder 12 determines from the 2-bit block headers whether any of the N scrambled blocks comprises a scrambled control block (SCB). If not ("N" at decision step 21), i.e. if all received blocks comprise scrambled data blocks, then operation proceeds to step 22. In this step, encoder 12 deletes the 2-bit block header from each scrambled block in the N-block sequence. Next, in step 23, an L-bit control header is added to the sequence. The control header is set to indicate whether the transcoded block contains any scrambled control blocks. In this instance there are no scrambled control blocks in the received block sequence, so the control header is set accordingly. The bit-sequence resulting from steps 22 and 23 constitutes the transcoded block which is then output in step 24 for onward transmission.

Returning to step 21, if it is determined from the input block headers that the received block sequence contains any scrambled control blocks ("Y" at decision 21), then operation proceeds to step 25 wherein encoder 12 deletes the 2-bit headers from all N scrambled input blocks as before. Next, in step 26, encoder 12 deletes a particular set of scrambled bits from the scrambled control block(s) in the sequence. The scrambled bits which are deleted correspond to respective block-type field bits of at least one control block in the corresponding sequence of N preliminary blocks which was scrambled to produce the received sequence of N scrambled blocks. That is, each deleted bit is at the same bit-position in a scrambled control block as a particular BTF bit in the corresponding preliminary control block. The deleted, scrambled bits are selected such that, if the corresponding BTF bits were missing from their control block(s) in the preliminary sequence then the other, remaining BTF bits in each control block would still be sufficient to indicate the control block type. This is explained in more detail below. Next, in step 27, the L-bit control header is added to the sequence to indicate, in this instance, that the transcoded block contains at least one control block. In step 28, the encoder 12 adds position indicator bits to the sequence. The position indicator bits indicate the positions of scrambled control blocks in the N-block sequence. (Since the block order is unchanged in this exemplary transcoding process, the scrambled control blocks are at the same positions in the block order of the encoded sequence as in the received block sequence). The position indicator bits here comprise N 1-bit flags, one for each block in the received sequence, to indicate whether that block is a scrambled data block (1) or a scrambled control block (0). In this way, the position indicator bits indicate the positions of data and control blocks in the block order of the sequence. These position indicator bits can be added to the sequence at various positions as discussed further below. The resulting bit-sequence provides the transcoded block which is output in step 24 as before. The transcoding process is then complete.

The following describes an example of the transcoding process in which the aforementioned set of deleted bits comprises N bits. These N bits correspond to respective block-type field (BTF) bits of the first (or only) control block in the sequence of N preliminary blocks corresponding to the N block sequence in input buffer 11. In the particular example to be described, N=4 for the transcoding operation. Hence, a sequence of four 66-bit scrambled blocks in input buffer 11 is processed by encoder 12 to produce a (256+L)-bit transcoded output block.

Figure 7A:
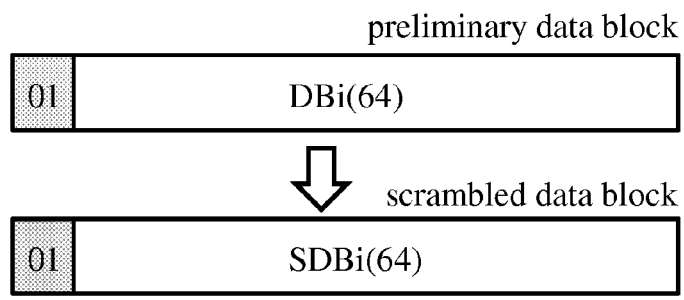
FIGS. 7A and 7B indicate the input block formats for the transcoding process.
Figure 7B:
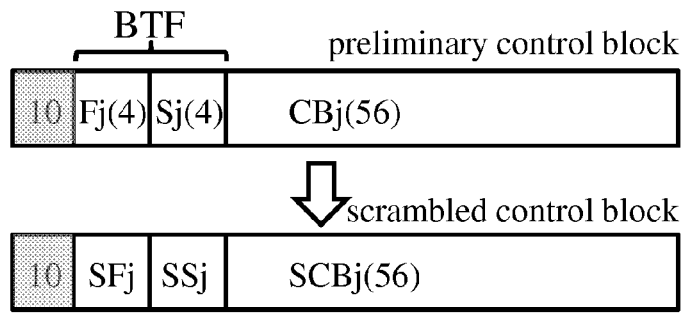

The notation employed for the 66-bit block format is indicated in FIG. 7A for data blocks and FIG. 7B for control blocks. In particular, FIG. 7A shows a preliminary (modulation encoded) data block #i with the 2-bit block header 01 and 64 bits of data denoted by DBi(64). The corresponding scrambled data block #i has the same 2-bit block header 01 and 64 bits of scrambled data denoted by SDBi(64). FIG. 7B shows a preliminary control block #j with the 2-bit block header 10 and an 8-bit block-type field (BTF) followed by 56 control bits denoted by CBj(56). The 8-bit BTF comprises a first 4-bit nibble Fj(4) and a second 4-bit nibble Sj(4). The corresponding scrambled control block #j has the same 2-bit block header 10 followed by eight scrambled bits corresponding to respective BTF bits in the unscrambled block. These eight scrambled bits consist of a first 4-bit nibble SFj and a second 4-bit nibble SSj. This is followed by 56 scrambled bits denoted by SCBj(56). The 8-bit block-type field of a preliminary control block comprises one of K=11 hexadecimal values indicative of control block-type as indicated in FIG. 1. In this system, the least-significant bit (LSB) of the block-type field is the first transmitted bit. For example, the block-type field 0x1E (binary value 00011110) is represented in a left-to-right transmission order of the control block as the BTF bit-pattern 01111000. Thus, when this BTF pattern is represented as a concatenation of first nibble Fj(4) and second nibble Sj(4), then Fj(4)=0111 and Sj(4)=1000 for the left-to-right transmission order.

Figure 8A:
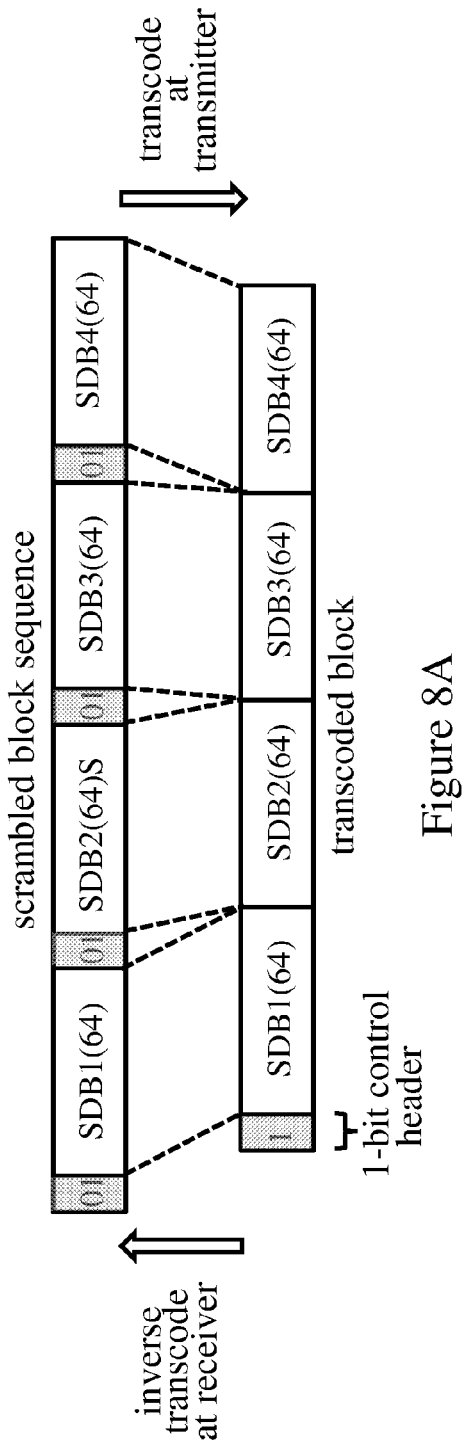
FIGS. 8A and 8B indicate operation of the transcoding process for respective sequences of input blocks.

FIG. 8A indicates operation of the transcoding method for an input block sequence comprising only scrambled data blocks, i.e. SDB#1, SDB#2, SDB#3, and SDB#4. The input sequence is shown at the top of the figure and the transcoded output block is shown at the bottom. As illustrated here, all input block headers are deleted as per step 22 of FIG. 6. In this embodiment, an (L=1)-bit control header is added to the front of the sequence in step 23 of FIG. 6. A control header of "1" here indicates no scrambled control blocks in the transcoded block, and a control header of "0" indicates that the transcoded block contains at least one scrambled control block.

Figure 8B:
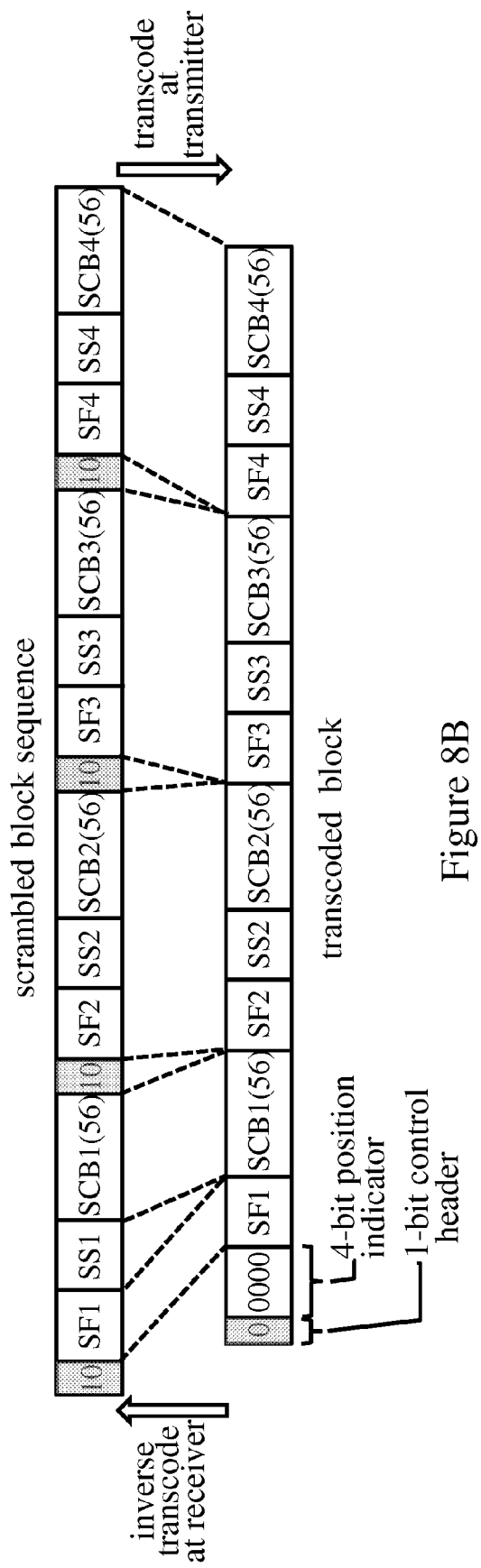

FIG. 8B indicates the transcoding operation for an input block sequence comprising only scrambled control blocks, i.e. SCB#1, SCB#2, SCB#3, and SCB#4. All block headers are deleted as per step 25 of the FIG. 6 process. The second nibble SS1 of the first control block SCB#1 constitutes the set of scrambled bits deleted in step 26 of FIG. 6. The 1-bit control header "0" is added to the sequence in step 27. In this embodiment, the position indicator bits added in step 28 form a 4-bit position indicator which is inserted at four bit-positions immediately following the control header. In this case, the position indicator is 0000 indicating that all of the following blocks are scrambled control blocks.

FIGS. 9A through 9D illustrate operation of the above transcoding process for respective further sequences of input blocks. FIG. 9A corresponds to an input block sequence SCB#1, SCB#2, SCB#3, and SDB#4. FIG. 9B corresponds to an input block sequence SDB#1, SCB#2, SCB#3, and SCB#4. FIG. 9C corresponds to an input block sequence SCB#1, SDB#2, SDB#3, and SCB#4. FIG. 9D corresponds to an input block sequence SDB#1, SCB#2, SCB#3, and SDB#4. The same basic process steps described above and illustrated in these figures can be used to generate transcoded output blocks for all other possible input block sequences.

The transcoding process of FIGS. 8A through 9D is similar to a process described in our U.S. application Ser. No. 13/765, 382 but the process is performed here on scrambled data and control blocks. The inverse transcoding operation at the receiver must reverse this process. In order to do this, however, the inverse transcoder 8 must recover the missing scrambled bits SSj deleted from transcoded blocks containing scrambled control blocks. The inverse transcoder 8 is illustrated schematically in FIG. 10. This comprises a descrambler 30 and a decoder 31. The descrambler 30 receives the transcoded blocks from EC unit 7 of FIG. 5 and descrambles these to provide the unscrambled preliminary blocks to decoder 31. Decoder 31 operates as detailed below to recover from the descrambler output the missing sets of scrambled bits SSj. Decoder 31 also receives the transcoded blocks from EC unit 7, and performs the inverse of the transcoding operation to regenerate from the transcoded blocks, and the recovered bit-sets SSj, the original sequences of N scrambled blocks for successive transcoded blocks. The main steps performed by decoder are indicated in FIG. 11.

Figures 11, 13:
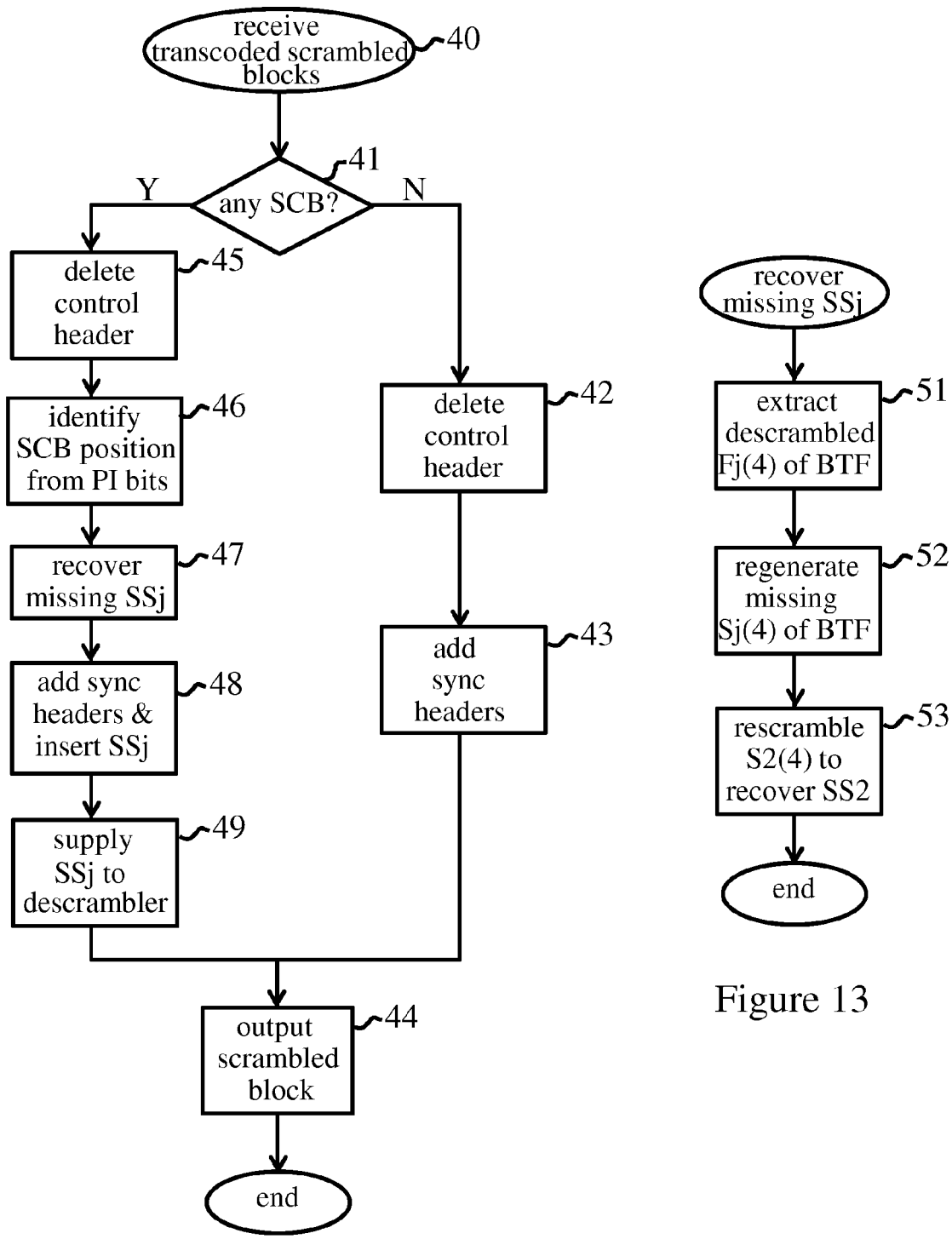
FIG. 11 indicates steps performed by a decoder of the inverse transcoder.
FIG. 13 indicates in more detail steps performed by the decoder in the FIG. 11 process.

The FIG. 11 process begins at step 40 on receipt of a transcoded block by decoder 31. In step 41, the decoder determines from the 1-bit control header whether the transcoded block contains any scrambled control blocks (SCB). If not ("N" at decision step 41), i.e. if the transcoded block comprises only scrambled data blocks, then operation proceeds to step 42. In this step, decoder 31 deletes the control header from the transcoded block. Next, in step 43 the decoder inserts the 2-bit data block header "01" in front of each 64-bit scrambled block SDB to restore the original scrambled block sequence shown in FIG. 8A. The resulting four-block sequence is then output in step 44, and the operation is complete.

Returning to step 41, if it is determined from the control header that the transcoded block contains any scrambled control blocks ("Y" at decision 41), then operation proceeds to step 45 wherein the control header is deleted from the transcoded block as before. Next, in step 46, the decoder determines the position of data and control blocks in the transcoded block from the four position indicator (PI) bits following the control header. In step 47 the decoder recovers (via a process detailed below based on the output of descrambler 30 for the current transcoded block) the set of scrambled bits SSj missing from the first scrambled control block. In step 48, the decoder inserts the 2-bit block header "01" or "10", as appropriate, in front of any scrambled data block, and each scrambled control block, in the sequence, and inserts the recovered bit-set SSj at the appropriate bit-positions in the first scrambled control block SCB. This regenerates the original sequence of N scrambled blocks as shown, for example, in FIGS. 9A through 9D. In step 49, the recovered bit-set SSj is also fed back by decoder 31 to descrambler 30 to permit correct descrambler operation as discussed below. The resulting four-block sequence is then output in step 44, and the operation is complete.

Figure 3:
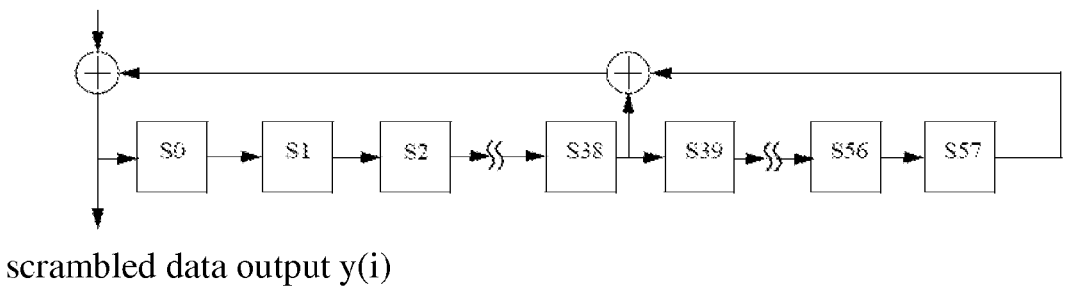
FIG. 3 shows the scrambler design for the FIG. 2 scrambling process.

Descrambler 30 is implemented by the self-synchronizing descrambler shown in FIG. 12 corresponding to the self-synchronizing scrambler of FIG. 3. This descrambler includes a 58-bit shift register S0 to S57 in a feedforward arrangement with two modulo-2 adders (labeled "+" in the figure). The scrambled bits y(i) at time i are supplied serially to the descrambler which outputs the corresponding unscrambled bits x(i), thereby recovering the original preliminary data and control blocks input to scrambler module 3. As is apparent from FIGS. 3 and 12, the scrambling and descrambling operations are continuous processes in which the bit values in the feedback and feedforward registers are continuously updated in dependence on bits of the input blocks supplied serially to the data input in each case. Correct scrambling and descrambling operation thus requires "complete" input blocks, i.e. including all missing bits, for correct, continuous operation. However, as described above, scrambled control blocks in transcoded blocks received by descrambler 30 have missing bits due to deletion of the bit-sets SSj during transcoding. In spite of this, it is still possible to regenerate the missing scrambled bits, and maintain continuity of the descrambler operation, as explained in the following.

The operation of decoder 31 to recover a missing bit-set SSj in step 47 of FIG. 11 is indicated in more detail in FIG. 13. In a first step, step 51, of this process, the decoder extracts the first nibble Fj(4) of the unscrambled BTF of the control block in question from the output of descrambler 31. Referring to FIG. 12, these four BTF bits are generated at the output of descrambler 30 as the corresponding four bits SFj of the descrambled control block are supplied as input bits y(i) to the descrambler. The next four bits required at the descrambler input are the missing bits SSj. Hence, in step 52 of FIG. 13, the decoder regenerates the missing second nibble Sj(4) of the control block BTF from the extracted first nibble Fj(4). Specifically, due to redundancy in the block-type field and the particular selection of the K=11 BTF values shown in FIG. 1, there is a unique mapping between the two nibbles Fj(4) and Sj(4) of any block-type field. This mapping is indicated in hexadecimal notation in the table of FIG. 14. Hence, the first BTF nibble Fj(4) is sufficient to indicate control block-type, whereby the missing second nibble Sj(4) can be identified to complete the block-type field. In step 53 of FIG. 13, the decoder re-scrambles the second nibble Sj(4) to recover the missing bit set SSj. This can be done without performing a full scrambling operation as explained in the following.

At any time i, the output y(i) of the FIG. 3 scrambler is given by:

$$y(i)=x(i)+S38(i)+S57(i) \quad (1)$$

where "+" represents modulo-2 addition here. Because the scrambled output y(i) feeds the shift register in this feedback arrangement, S38(i)=y(i−39) and S57(i)=y(i−58), whereby:

$$y(i)=x(i)+y(i-39)+y(i-58) \quad (2)$$

Similarly, the output x(i) of the descrambler 30 at any time i is given by:

$$x(i)=y(i)+S38(i)+S57(i) \quad (3)$$

Because the scrambled input y(i) feeds the shift register in this feedforward arrangement, again S38(i)=y(i−39) and S57(i)=y(i−58), whereby:

$$x(i)=y(i)+y(i-39)+y(i-58) \quad (4)$$

Hence, the contents of the shift registers in the scrambler and descrambler are the same at any corresponding time i. It follows from equations (4) and (2) that the four scrambled bits y(i) making up the deleted bit-set SSj can be obtained from the known unscrambled bits x(i) of the regenerated second nibble Sj(4) by simple modulo-2 addition, via equation (2), of the appropriate, previously-received scrambled bits y(i−39) and y(i−58). Since these bits are all contained in the shift register of descrambler 30, in step 53 of FIG. 13 the decoder can obtain these bits from the descrambler, perform the modulo-2 additions to scramble the bits Sj(4) and recover the missing bits SSj. Referring back to FIG. 11, the recovered missing bits SSj can thus be inserted in the scrambled control block in step 48. Moreover, in step 49, the recovered bits SSj can also be supplied in succession to the descrambler 30 as the four input bits y(i) following the scrambled bits SFj, thereby maintaining continuity of descrambler operation.

Figures 4A, 4B:
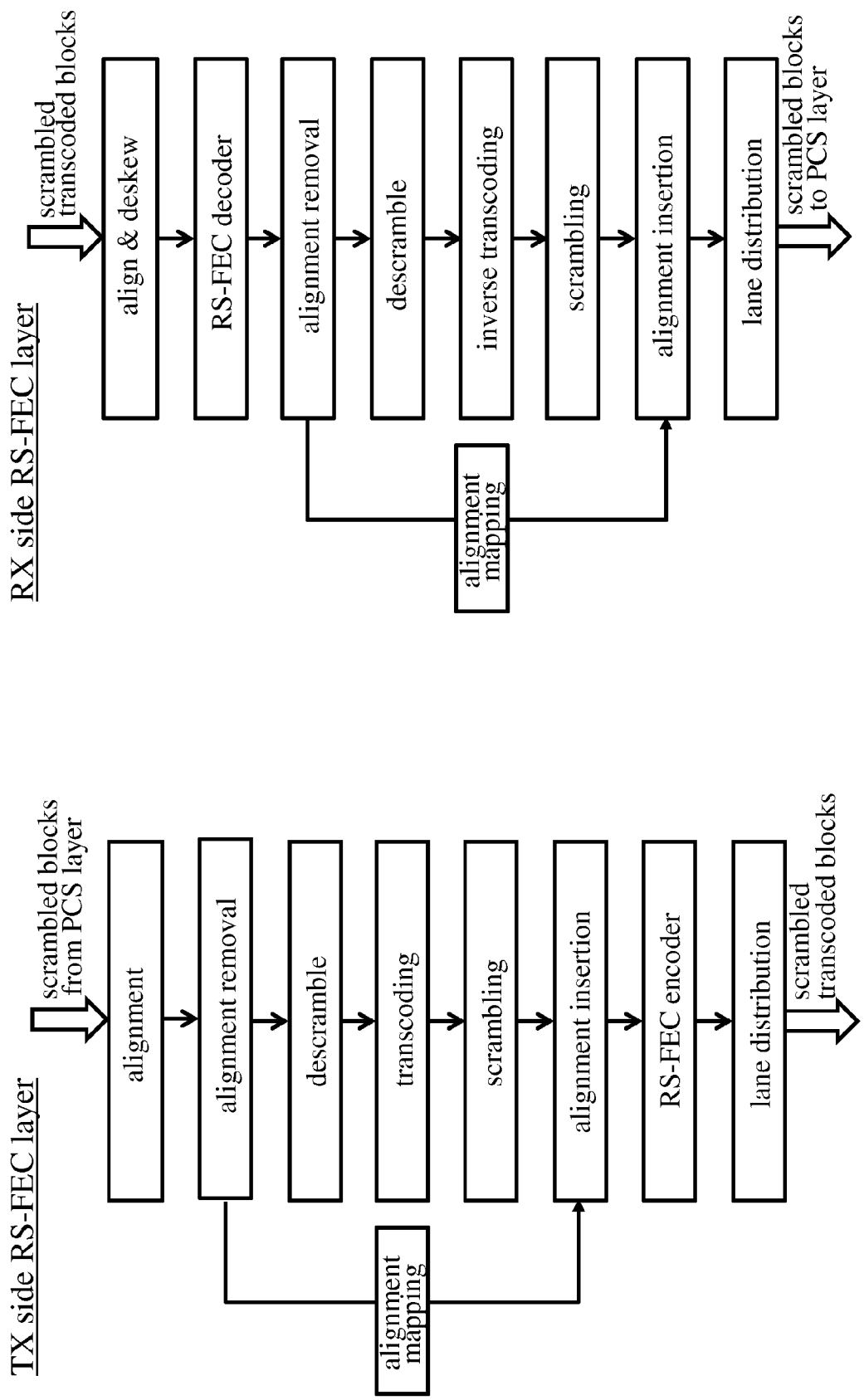
FIGS. 4A and 4B indicate structure of the RS-FEC sublayer, in the transmitter and receiver respectively, as currently defined for 100 Gb/s Ethernet.
Figures 15A, 15B:
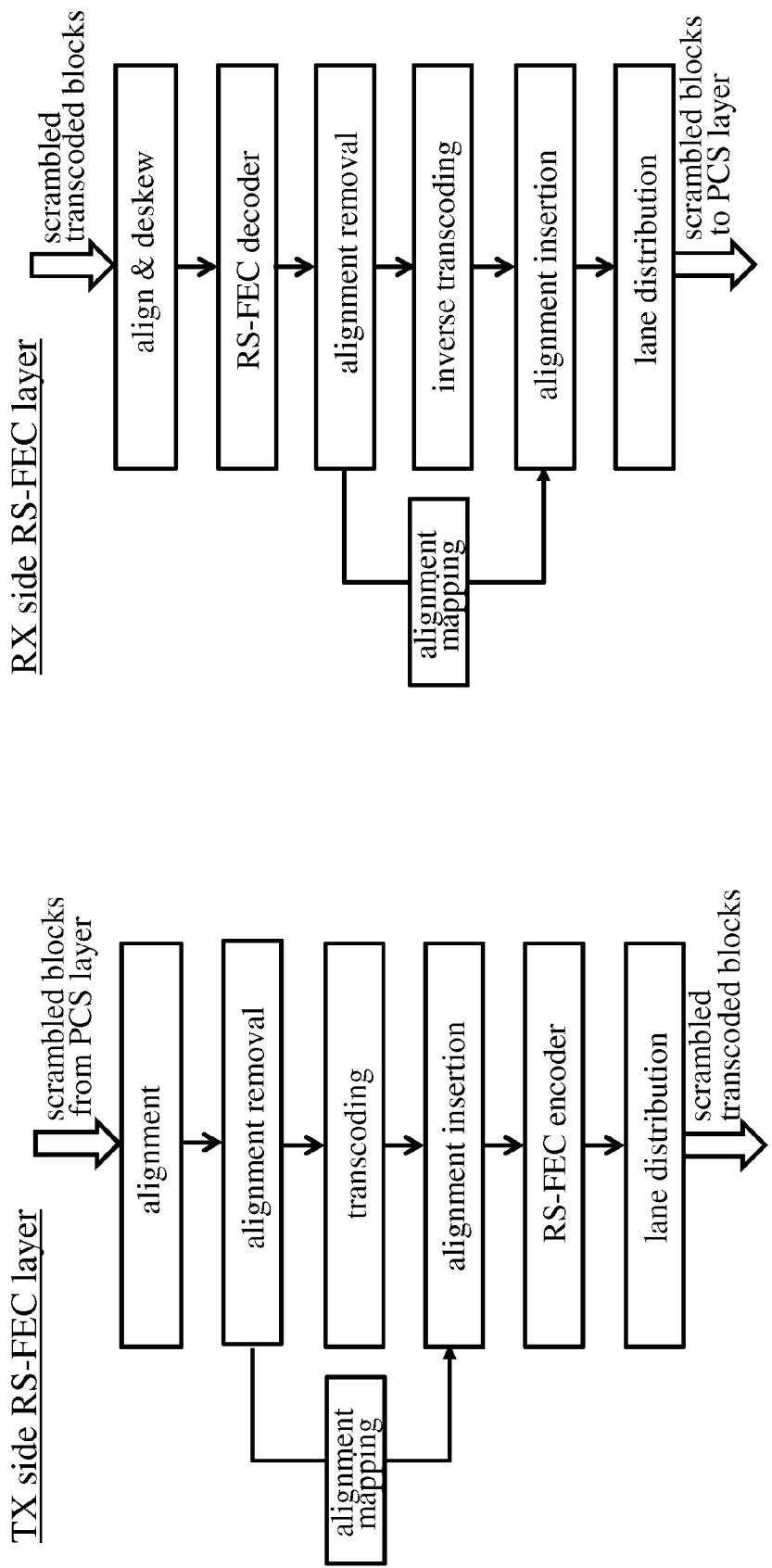
FIGS. 15A and 15B indicate structure of an RS-FEC sublayer, in the transmitter and receiver respectively, using encoding/decoding methods embodying the invention.

By permitting transcoding of scrambled blocks, the above system eliminates several stages of scrambling and descrambling necessary with prior transcoding techniques. This allows significant simplification of the overall communication system. For example, using the above transcoding system, the RS-FEC sublayer of FIGS. 4A and 4B can be reduced to the simple architecture shown in FIGS. 15A and 15B. Moreover, the system avoids the need for a self-synchronizing scrambler in the RS-FEC sublayer of the receiver, obviating the problem of massive error multiplication. Any errors in the transcoded bocks are restricted to the four recovered bits SSj in the inverse transcoder, dramatically reducing error propagation. Moreover, because block type fields cannot occur in a random order in the application described, any error propagation here can be conveniently detected by a state machine in a higher layer.

Various modifications to the above transcoding system can be envisaged. For example, various modifications are described in our U.S. application Ser. No. 13/765,382 (the relevant content of which his incorporated herein by reference) for the process of transcoding non-scrambled blocks. Corresponding modifications can be made to the transcoding process described above. For example, an (L=2)-bit control header may be employed for the transcoded block to implement a rate 256/258 code. As another example, the scrambled bit-set deleted in the transcoding process may correspond to the first nibble Fj(4), rather than the second nibble Sj(4), of the control block BTF field. In this case, continuity of descrambler operation requires dummy bits corresponding to the scrambled missing bits SFj to be fed to the input of descrambler 30. These bits can be replaced in the shift register contents after they are recovered by mapping from the descrambled second nibble Sj(4) and rescrambling in decoder 31. Other bit-sets corresponding to BTF bits may also be selected for deletion, such as those corresponding to the middle four BTF bits. As will be apparent to those skilled in the art, however, the probability of error propagation may differ for different bit-sets. The selected bit-set is ideally that which minimizes error propagation in a given system.

The position indicator bits in the above system could be added to the sequence in various places. These PI bits could be distributed across the transcoded block, e.g. one PI bit ahead of each scrambled block to indicate whether that block is a scrambled data or control block. The control header (and PI bits) might also be added at the end of the scrambled block sequence in some embodiments.

It will of course be appreciated that the various process steps of FIGS. 6 and 11 can be performed in any convenient order, and different steps may be performed wholly or partially in parallel by encoder 10 or decoder 31 as appropriate. The input block length and number N of blocks in the input sequence may of course differ in other embodiments.

Figure 16:
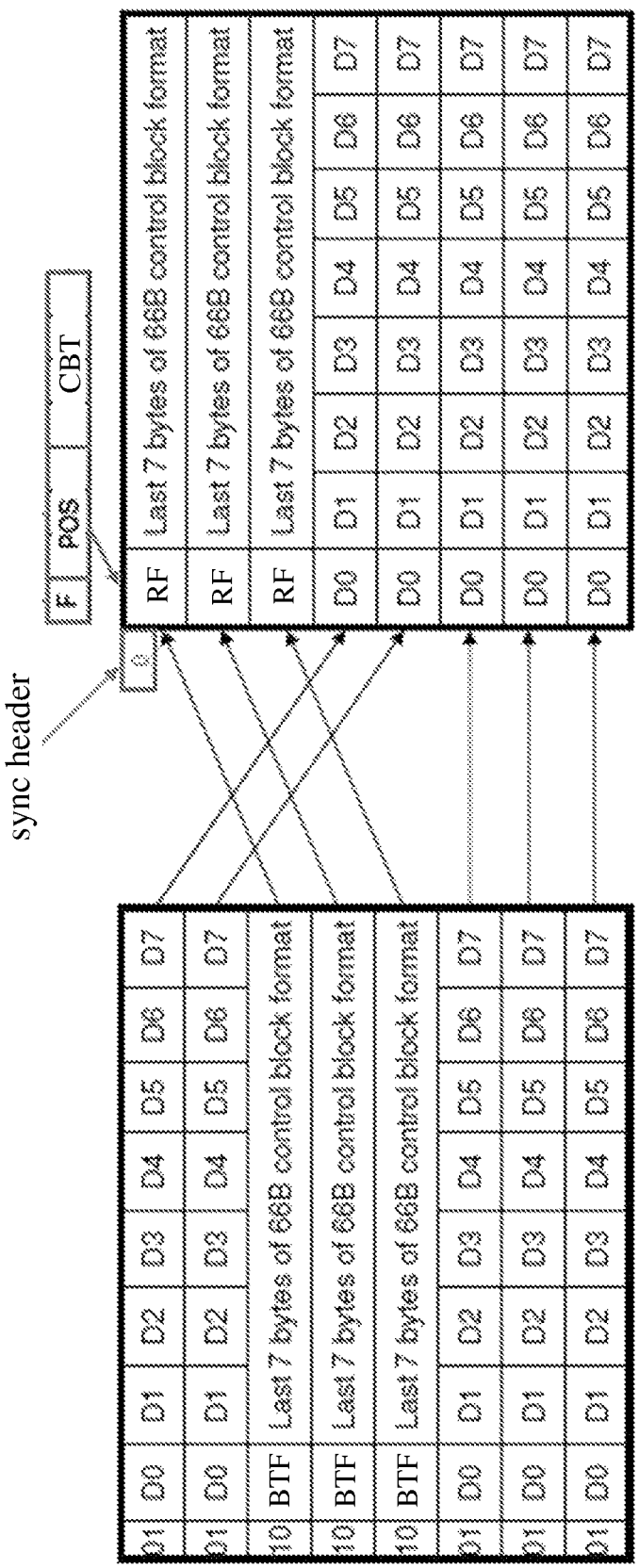
FIG. 16 indicates operation of a prior transcoding process based on reordering of data and control blocks.

While the exemplary embodiments above preserve the block-order in the transcoding process, alternative embodiments may reorder the sequence of scrambled blocks in a predetermined manner. For example, an embodiment may be based on a prior 512b/513b transcoding scheme illustrated in FIG. 16 in which control blocks are grouped together at the start of the transcoded block. The left-hand side of the figure illustrates a sequence of N=8 66-bit blocks, of the FIG. 1 format, forming the input sequence for the transcoding operation. These consist of two data blocks (header 01) followed by three control blocks (header 10) and then three more data blocks. The output block of the transcoding process is formatted as shown on the right-hand side of the figure. The output block consists of 513 bits commencing with a single sync header bit shown in the upper left corner of the block.

This header bit is "1" if the transcoded block contains only data blocks, and "0" if the transcoded block contains any control blocks. The remainder of the block is constructed by deleting all 2-bit headers from the input blocks. All input control blocks are grouped together at the start of the output block, after the sync bit. The block-type field of each control block is deleted in its entirety and replaced by an 8-bit replacement field denoted by RF in the figure. This field consists of a 1-bit flag F, a 3-bit position field POS, and a 4-bit code field CBT. The flag F indicates whether the next (i.e. after the current) block is a control block (F=1) or a data block (F=0). The code field CBT is a 4-bit encoding indicating the control block type. The POS field consists of a 2-bit position index which indicates the original position of the current control block in the sequence of eight input blocks, and 1-bit parity information. After deletion of the input block header bits, this scheme effectively applies a rate 512b/513b code to the four 64-bit data and control blocks at the input.

If the input blocks to the above process are already scrambled, the transcoding operation can be adapted to reorder scrambled control blocks to the start of the transcoded block as above. The four bits SSj (for preference) corresponding to the second BTF nibble are then deleted from every scrambled control block. The four bits SFj corresponding to the first BTF nibble are then retained in place of the 4-bit encoding CBT in the replacement field RF. The first four bits of the replacement field RF remain the same as in FIG. 16, whereby the POS bits provide the position indicator bits permitting restoration of the block order prior to descrambling in the inverse transcoder. The retained bits SFj permit recovery of the missing scrambled bits in the decoder, while still ensuring continuous descrambler operation, in the manner described earlier. Other similar transcoding schemes involving reordering of blocks can be envisaged for other code rates. For instance, schemes for sequences of N=4, 8 or 16 scrambled blocks can be based on prior 256b257b transcoding methods or the 512b/514b and 1024b/1027b transcoding methods of the Teshimi, et al., reference discussed earlier.

It will be appreciated that many other changes and modifications can be made to the exemplary embodiments described without departing from the scope of the invention.

The invention claimed is:

1. A data encoding method, comprising:
receiving a sequence of N scrambled blocks produced by scrambling a corresponding sequence of N preliminary blocks each of which comprises one of a data block and a control block, the control block being one of K types of control block and including a block-type field indicating the type of that control block, wherein each scrambled block has a block header indicating whether that scrambled block is a scrambled data block or a scrambled control block;
encoding the sequence of N scrambled blocks into an encoded block by deleting the block header of each scrambled block, and in the event the sequence contains any scrambled control blocks, deleting from the sequence a set of scrambled bits corresponding to respective block-type field bits of at least one control block in the sequence of preliminary blocks such that the other block-type field bits of the at least one control block are sufficient to indicate the type of that control block, and adding position indicator bits indicating position of each scrambled control block in the received sequence of scrambled blocks.

2. The method according to claim 1, wherein the encoding is performed such that the order of the N scrambled blocks in the sequence is maintained in the encoded block.

3. The method according to claim 2, wherein the set of scrambled bits contains N bits.

4. The method according to claim 2, wherein the scrambled bits in the set correspond to respective block-type field bits of the first control block in the sequence of preliminary blocks.

5. The method according to claim 3, wherein N=4 and the block-type field is eight bits long, and wherein the set of scrambled bits corresponds to the last four block-type field bits of the first control block in the sequence of preliminary blocks.

6. The method according to claim 3, wherein N=4 and the block-type field is eight bits long, and wherein the set of scrambled bits corresponds to the first four block-type field bits of the first control block in the sequence of preliminary blocks.

7. The method according to claim 1, further comprising adding to the encoded block an L-bit control header indicating whether that encoded block contains any scrambled control blocks.

8. The method according to claim 7, wherein $1 \leq L \leq 2$.

9. The method according to claim 1, wherein each of the scrambled and preliminary blocks is a 64-bit block.

10. The method according to claim 9, wherein each scrambled block has a 2-bit block header.

11. The method according to claim 1, wherein:
in the event the sequence of scrambled blocks contains any scrambled control blocks, the encoding includes reordering the sequence of scrambled blocks in a predetermined manner; and
the set of scrambled bits comprises scrambled bits corresponding to block-type field bits of every control block in the sequence of preliminary blocks.

12. The method according to claim 1, further comprising scrambling the sequence of N preliminary blocks to produce the sequence of N scrambled blocks.

13. The method according to claim 1, wherein the sequence of N scrambled blocks is produced from the sequence of N preliminary blocks by a self-synchronizing scrambler.

14. A data decoding method, comprising:
receiving encoded blocks produced by a method according to claim 1;
descrambling the encoded blocks to recover the other block-type field bits of the at least one control block in the sequence of preliminary blocks corresponding to a received encoded block containing any scrambled control blocks;
regenerating missing block-type field bits of the at least one control block from the other block-type field bits;
rescrambling the missing block-type field bits regenerated for a received encoded block to recover the set of scrambled bits deleted from the sequence of N scrambled blocks corresponding to that encoded block; and
regenerating the sequences of N scrambled blocks corresponding to received encoded blocks from the encoded blocks and the recovered sets of scrambled bits.

15. The method according to claim 14, wherein the sequence of N scrambled blocks encoded into a received encoded block is produced from the sequence of N preliminary blocks by a self-synchronizing scrambler, and further comprising:
performing the descrambling of the encoded blocks using a self-synchronizing descrambler; and supplying the recovered sets of scrambled bits to the self-synchronizing descrambler for use in the descrambling.

16. A method for communicating data over a data communications network, the method comprising:
receiving a sequence of N scrambled blocks produced by scrambling a corresponding sequence of N preliminary blocks each of which comprises one of a data block and a control block, the control block being one of K types of control block and including a block-type field indicating the type of that control block, wherein each scrambled block has a block header indicating whether that scrambled block is a scrambled data block or a scrambled control block;
encoding the sequence of N scrambled blocks into an encoded block by deleting the block header of each scrambled block, and if the sequence contains any scrambled control blocks, deleting from the sequence a set of scrambled bits corresponding to respective block-type field bits of at least one control block in the sequence of preliminary blocks such that the other block-type field bits of the at least one control block are sufficient to indicate the type of that control block, and adding position indicator bits indicating position of each scrambled control block in the received sequence of scrambled blocks;
transmitting encoded blocks produced by the encoding of respective sequences of N scrambled blocks over the network to a receiver; and
at the receiver, descrambling the encoded blocks to recover the other block-type field bits of the at least one control block in the sequence of preliminary blocks corresponding to a received encoded block containing any scrambled control blocks, regenerating missing block-type field bits of the at least one control block from the other block-type field bits, rescrambling the missing block-type field bits regenerated for a received encoded block to recover the set of scrambled bits deleted from the sequence of N scrambled blocks corresponding to that encoded block, and regenerating the sequences of N scrambled blocks corresponding to received encoded blocks from the encoded blocks and the recovered sets of scrambled bits.

17. A data encoding apparatus for encoding a sequence of N scrambled blocks into an encoded block, the sequence of N scrambled blocks being produced by scrambling a corresponding sequence of N preliminary blocks each of which comprises one of a data block and a control block, the control block being one of K types of control block and including a block-type field indicating the type of that control block, wherein each scrambled block has a block header indicating whether that scrambled block is a scrambled data block or a scrambled control block, the apparatus comprising:
an input buffer configured to receive the sequence of N scrambled blocks; and
an encoder configured to produce the encoded block by deleting the block header of each scrambled block, and in the event the sequence contains any scrambled control blocks, deleting from the sequence a set of scrambled bits corresponding to respective block-type field bits of at least one control block in the sequence of preliminary blocks such that the other block-type field bits of the at least one control block are sufficient to indicate the type of that control block, and adding position indicator bits indicating position of each scrambled control block in the received sequence of scrambled blocks.

18. The apparatus according to claim 17, wherein:
the encoder is configured such that the order of the N scrambled blocks in the sequence is maintained in the encoded block;
each of the scrambled and preliminary blocks is a 64-bit block;
N=4 and the block-type field is eight bits long; and
the set of scrambled bits corresponds to one of the last four and first four block-type field bits of the first control block in the sequence of preliminary blocks.

19. A data decoding apparatus for receiving and decoding encoded blocks produced by encoding apparatus according to claim 17, the apparatus comprising a descrambler configured to descramble the encoded blocks to recover the other block-type field bits of the at least one control block in the sequence of preliminary blocks corresponding to a received encoded block containing any scrambled control blocks, and a decoder configured to:
regenerate missing block-type field bits of the at least one control block from the other block-type field bits;
rescramble the missing block-type field bits regenerated for a received encoded block to recover the set of scrambled bits deleted from the sequence of N scrambled blocks corresponding to that encoded block; and
regenerate the sequences of N scrambled blocks corresponding to received encoded blocks from the encoded blocks and the recovered sets of scrambled bits.

20. The apparatus according to claim 19 wherein the sequence of N scrambled blocks encoded into a received encoded block is produced from the sequence of N preliminary blocks by a self-synchronizing scrambler, and wherein:
the descrambler comprises a self-synchronizing descrambler; and
the decoder is configured to supply the recovered sets of scrambled bits to the self-synchronizing descrambler for use in the descrambling.

* * * * *